(12) United States Patent
Subramaniyan et al.

(10) Patent No.: US 10,127,027 B2
(45) Date of Patent: Nov. 13, 2018

(54) SCALABLE AND SECURE ANALYTIC MODEL INTEGRATION AND DEPLOYMENT PLATFORM

(71) Applicant: General Electric Company, Schenectady, NY (US)

(72) Inventors: Arun Karthi Subramaniyan, Niskayuna, NY (US); Alexandre Iankoulski, Niskayuna, NY (US); John Lazos, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 71 days.

(21) Appl. No.: 15/338,951

(22) Filed: Oct. 31, 2016

(65) Prior Publication Data

US 2018/0121183 A1    May 3, 2018

(51) Int. Cl.
 *G06F 9/46* (2006.01)
 *G06F 8/60* (2018.01)
 *G06F 9/455* (2018.01)

(52) U.S. Cl.
 CPC ............ *G06F 8/60* (2013.01); *G06F 9/45558* (2013.01); *G06F 2009/45595* (2013.01)

(58) Field of Classification Search
 None
 See application file for complete search history.

(56) References Cited

U.S. PATENT DOCUMENTS

| | | |
|---|---|---|
| 7,149,734 B2 | 12/2006 | Carlson et al. |
| 7,757,214 B1 * | 7/2010 | Palczak ................. G06F 9/5083 709/223 |
| 8,533,676 B2 | 9/2013 | Watters et al. |
| 8,745,585 B2 | 6/2014 | Watters et al. |
| 9,020,868 B2 | 4/2015 | Elkins et al. |
| 9,098,292 B1 * | 8/2015 | Zhang ..................... G06F 8/35 |

(Continued)

FOREIGN PATENT DOCUMENTS

WO    2006/135607 A2    12/2006

OTHER PUBLICATIONS

"5725-M54 IBM UrbanCode Deploy V6.2", IBM, Feb. 16, 2016, retrieved on Sep. 20, 2016, retrieved from http://www.01.ibm.com/common/ssi/printableversion.wss?docURL=/common/ssi/rep_sm/ . . . , 14pgs.

(Continued)

*Primary Examiner* — Gregory A Kessler
(74) *Attorney, Agent, or Firm* — GE Global Patent Operation; Nitin Joshi

(57) ABSTRACT

According to some embodiments, system, apparatus and methods are provided comprising an analytic model for an installed product; an execution platform configured to execute the analytic model; an application programming interface (API) wrapper associated with each of the analytic model and the execution platform, the API wrapper including input information, output information and a technique; and a storage in communication with the analytic model and the execution platform and storing program instructions to perform the functions as follows: transmitting information between the analytic API wrapper and the execution platform API wrapper; and deploying the analytic model to the execution platform based on the transmitted information. Numerous other aspects are provided.

19 Claims, 14 Drawing Sheets

(56) References Cited

U.S. PATENT DOCUMENTS

| | | | |
|---|---|---|---|
| 2001/0027388 A1* | 10/2001 | Beverina | G06Q 20/203 |
| | | | 703/22 |
| 2007/0244650 A1* | 10/2007 | Gauthier | G06Q 10/10 |
| | | | 702/19 |
| 2012/0173004 A1* | 7/2012 | Radl | G05B 13/0265 |
| | | | 700/29 |
| 2016/0034380 A1 | 2/2016 | Shani et al. | |
| 2016/0124742 A1 | 5/2016 | Rangasamy et al. | |
| 2017/0178027 A1* | 6/2017 | Duggan | G06F 17/30312 |

OTHER PUBLICATIONS

Shipley, Philip "Demystifying Continuous Integration, Deliver, and Deployment", Codeship, Aug. 10, 2016, retrieved on Sep. 20, 206, retrieved from https://blog.codeship.com/demystifying-continuous-integration-delivery-deployment/, 19pgs.

Raj, Chelliah Pethuru et al., "Use big data and fast data analytics to achieve analytics as a service (AaaS)", Sep. 24, 2015, 13pgs.

\* cited by examiner

REGISTER NEW TECHNIQUE

TEMPLATES
BUILD
BUILD TEMPLATE
[● NEW]
BUILD RESULTS TEMPLATE
[● NEW]

TECHNIQUE TYPE: [CONTAINER ▼]
END POINT

RUN COMMAND

TECHNIQUE NAME
[TECHNIQUE-NAME]
TECHNIQUE LABEL
[TECHNIQUE LABEL]
TECHNIQUE VERSION
[1.0]

TECHNIQUE DESCRIPTION

TAGS
[ADD A TAG]
[SAVE]  * PLEASE FILL IN ALL FIELDS

SCALABLE AND SECURE ANALYTIC MODEL INTEGRATION AND DEPLOYMENT PLATFORM

CROSS-REFERENCE TO RELATED APPLICATIONS

The present application is related to U.S. patent application Ser. No. 15/338,839, filed Oct. 31, 2016, entitled "System Architecture for Secure and Rapid Development, Deployment and Management of Analytics and Software Systems", U.S. patent application Ser. No. 15/338,922, filed Oct. 31, 2016, entitled "Integrated Development Environment for Analytic Authoring", and U.S. patent application Ser. No. 15/338,886, filed Oct. 31, 2016, entitled "Self-Aware and Self-Registering Software & Analytics Platform Components," all of which are hereby incorporated herein by reference in their entirety for all purposes.

BACKGROUND

It is often desirable to make assessment and/or predictions regarding the operation of a real world physical system, such as an electro-mechanical system.

Conventionally, models are used to analyze data and generate results that may be used to make assessments and/or predictions of the physical system. Models may be an important aspect in making industrial systems function efficiently. A model may be built on a local computer and then the model is transmitted to another computer to be executed. However, running the model on a computer different from where it was built may involve re-writing the model program and de-bugging the program, which may be very time consuming and error-prone. This re-writing/de-bugging process may be repeated each time the model is run on another system.

It would therefore be desirable to provide systems and methods to facilitate model construction for a physical system in a more efficient and accurate manner.

BRIEF DESCRIPTION

According to some embodiments, a system includes an analytic model for an installed product; an execution platform configured to execute the analytic model; an application programming interface (API) wrapper associated with each of the analytic model and the execution platform, the API wrapper including input information, output information and a technique; and a storage in communication with the analytic model and the execution platform and storing program instructions to perform the functions as follows: transmitting information between the analytic API wrapper and the execution platform API wrapper; and deploying the analytic model to the execution platform based on the transmitted information.

According to some embodiments, the method includes providing an analytic model for an installed product; providing an execution platform to execute the analytic model; providing an application programming interface (API) wrapper associated with each of the analytic model and the execution platform, the API wrapper including input information, output information and a technique; and deploying the analytic model to the execution platform based on communication between the analytic model API wrapper and the execution platform API wrapper.

A technical effect of some embodiments of the invention is an improved technique and system for rapid development and deployment of an analytic and software system. With this and other advantages and features that will become hereinafter apparent, a more complete understanding of the nature of the invention can be obtained by referring to the following detailed description and to the drawings appended hereto.

Other embodiments are associated with systems and/or computer-readable medium storing instructions to perform any of the methods described herein.

DRAWINGS

FIG. 8 illustrates an interface according to some embodiments.

DETAILED DESCRIPTION

Figure 1:
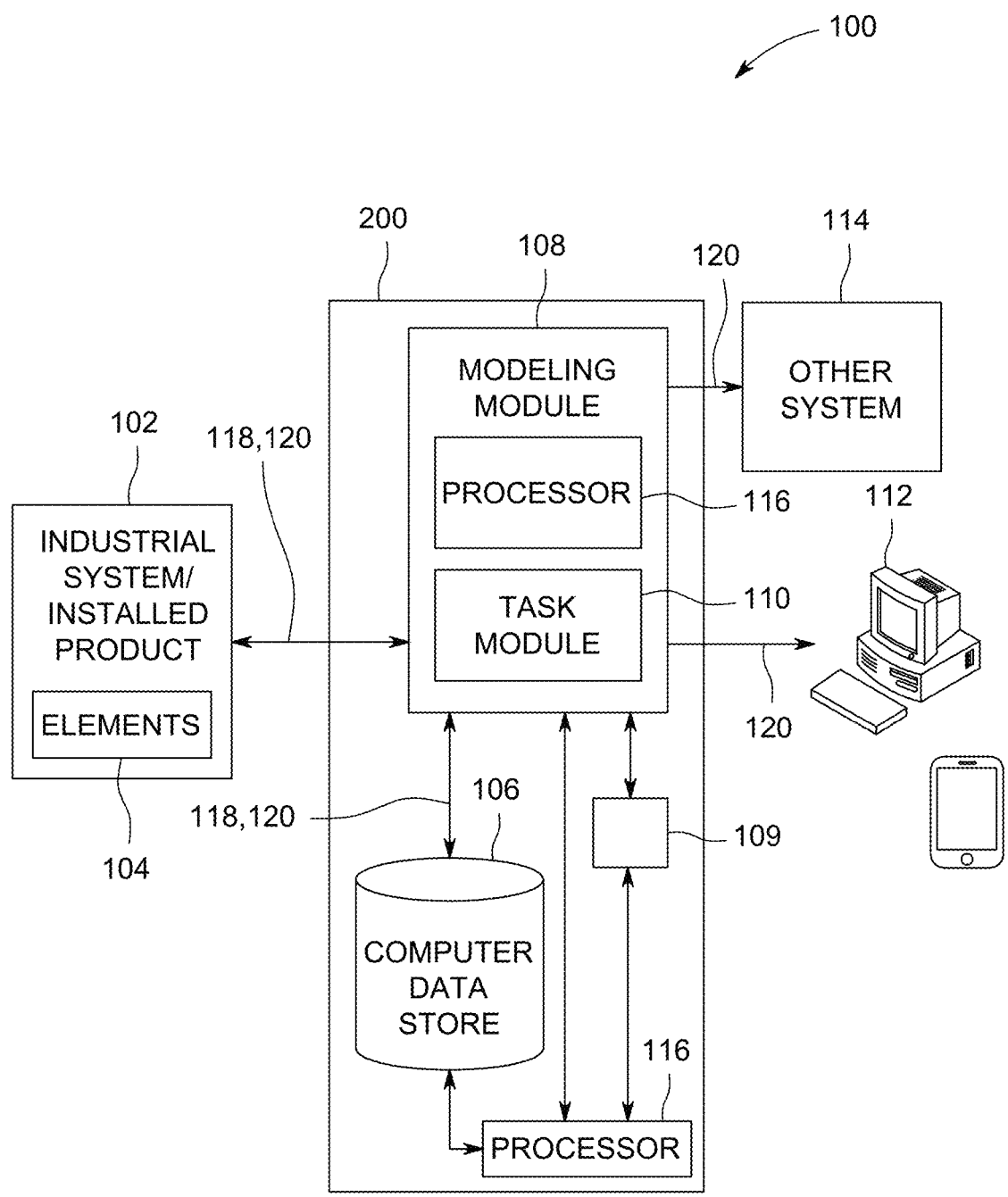
FIG. 1 illustrates a system according to some embodiments.

In the following detailed description, numerous specific details are set forth in order to provide a thorough understanding of embodiments. However, it will be understood by those of ordinary skill in the art that the embodiments may be practiced without these specific details. In other instances, well-known methods, procedures, components and circuits have not been described in detail so as not to obscure the embodiments.

It is often desirable to make assessment and/or predictions regarding the operation of a real world physical system, such as an electro-mechanical system.

Conventionally, computational models are used to analyze data and generate results that may be used to make assessments and/or predictions of the physical system. Models may be an important aspect in making industrial systems function efficiently. A model may be built on a local computer and then the model may be transmitted to another computer for execution. However, running the model on a computer different from where it was built may involve re-writing and/or debugging the model program, which may be very time consuming. This re-writing/de-bugging process may be repeated each time the model is run on another system. Additionally, industrial-grade systems may be complex and may involve hundreds of building blocks to work together seamlessly in production environments. Each block may be managed over its lifecycle to preserve the overall product integrity. As the blocks evolve, it may be difficult to manage the dependencies and handoffs between these blocks. Another challenge with conventional systems may be that not all blocks change at the same time, therefore the blocks may need to be managed individually, sometimes keeping different versions of the same blocks running in parallel. Building these conventional systems may involve large teams of developers with multiple technical backgrounds to work together to build the system.

An example of a model may be a Remaining Useful Life ("RUL") model that may predict a remaining useful life of an electro-mechanical system, such as an aircraft engine, to help plan when the system should be replaced. Likewise, an owner or operator of a system might want to monitor a condition of the system, or a portion of the system to help make maintenance decisions, budget predictions, etc.

Some embodiments relate to digital twin modeling. "Digital twin" state estimation modeling of industrial apparatus and/or other mechanically operational entities may estimate a RUL of a twinned physical system using sensors, communications, modeling, history and computation. It may provide an answer in a time frame that is useful, that is, meaningfully priori to a projected occurrence of a failure event or sub-optimal operation. The information may be provided by a "digital twin" of a twinned physical system. The digital twin may be a computer model that virtually represents the state of an installed product. The digital twin may include a code object with parameters and dimensions of its physical twin's parameters and dimensions that provide measured values, and keeps the values of those parameters and dimensions current by receiving and updating values via outputs from sensors embedded in the physical twin. The digital twin may have respective virtual components that correspond to essentially all physical and operational components of the installed product.

As used herein, references to a "digital twin" should be understood to represent one example of a number of different types of modeling that may be performed in accordance with teachings of this disclosure.

The term "installed product" should be understood to include any sort of mechanically or electronically or chemically operational entity, including, but not limited to, jet engines, locomotives, gas turbines, and wind farms. The term is most usefully applied to large complex systems with many moving parts and numerous sensors installed in the system. The term "installed" includes integration into physical operations such as the use of engines in an aircraft fleet whose operations are dynamically controlled, a locomotive in connection with railroad operations, or apparatus construction in, or as part of, an operating plant building.

As used herein, the term "automatically" may refer to, for example, actions that may be performed with little or no human interaction.

Embodiments provide for minimal set-up time of a development environment for new platform developers.

FIG. 1 is a block diagram of a system 100 provided according to some embodiments. The system 100 may include a plant or "installed product" 102. As noted above, the installed product 102 may be, in various embodiments, a complex mechanical entity such as the production line of a factory, a gas-fired electrical generating plant, a jet engine on an aircraft amongst a fleet, a wind farm, a locomotive, etc. The installed product 102 may include a considerable (or even very large) number of physical elements 104, which for example may include turbine blades, fasteners, rotors, bearings, support members, housings, etc.

The system 100 may include a platform 200 that may host a computer data store 106 (e.g., storage), a modeling module 108 and other elements 109. The computer data store 106 may provide information to the modeling module 108 and may store results from the modeling module 108. The platform 200 and the modeling module 108 may include one or more processing elements 116. The processor 116 may, for example, be a conventional microprocessor, and may operate to control the overall functioning of the platform 200 and the modeling module 108.

In one or more embodiments, the data store 106 may comprise any combination of one or more of a hard disk drive, RAM (random access memory), ROM (read only memory), flash memory, etc. The data store 106 may store software that programs the processor 116 and the modeling module 108 to perform functionality as described herein. Data in the data store 106 may also include, for example, information about physical elements 104 of the installed product 102, such as historic engine sensor information about a number of different aircraft engines and prior aircraft flights (e.g., external temperatures, exhaust gas temperatures, engine model numbers, takeoff and landing airports, etc.).

The modeling module 108, according to some embodiments, may access the data store 106 and utilize a model creation unit or task module 110 to create an analytic model that may be used to create a prediction and/or result that may be transmitted to at least one of various user platforms 112, back to the installed product 102 or to other systems 114, as appropriate (e.g., for display to a user, operation of the installed product, operation of another system, or input to another system). As used herein, the term "predictive model" and "analytic model" may be used interchangeably.

The modeling module 108 may be programmed with one or more software components that may model individual elements 104 that make up the installed product 102.

A communication channel 118 may be included in the system 100 to supply data from at least one of the installed product 102 and the data store 106 to the modeling module 108.

In some embodiments, the system 100 may also include a communication channel 120 to supply output from one or more models in the modeling module 108 to at least one of user platforms 112, back to the installed product 102, or to other systems 114. In some embodiments, signals received by the user platform 112, installed product 102 and other systems 114 may cause modification in the state or condition or another attribute of one or more physical elements 104 of the installed product 102.

Although not separately shown in the drawing, one or more control units, processors, computers or the like may be included in the installed product 102 to control operation of the installed product 102, with or without input to the control units, etc., from the modeling module 108.

As used herein, devices, including those associated with the system 100 and any other devices described herein, may exchange information via any communication network which may be one or more of a Local Area Network ("LAN"), a Metropolitan Area Network ("MAN"), a Wide Area Network ("WAN"), a proprietary network, a Public Switched Telephone Network ("PSTN"), a Wireless Application Protocol ("WAP") network, a Bluetooth network, a wireless LAN network, and/or an Internet Protocol ("IP") network such as the Internet, an intranet, or an extranet. Note that any devices described herein may communicate via one or more such communication networks.

A user may access the system 100 via one of the user platforms 112 (e.g., a personal computer, tablet, or smartphone) to view information about and/or manage an installed product 102 and/or develop models and platforms in accordance with any of the embodiments described herein. According to some embodiments, an interactive graphical display interface may let a platform developer develop a platform and a model developer develop models, define and/or adjust certain parameters and/or provide or receive automatically generated recommendations or results.

Figure 2:
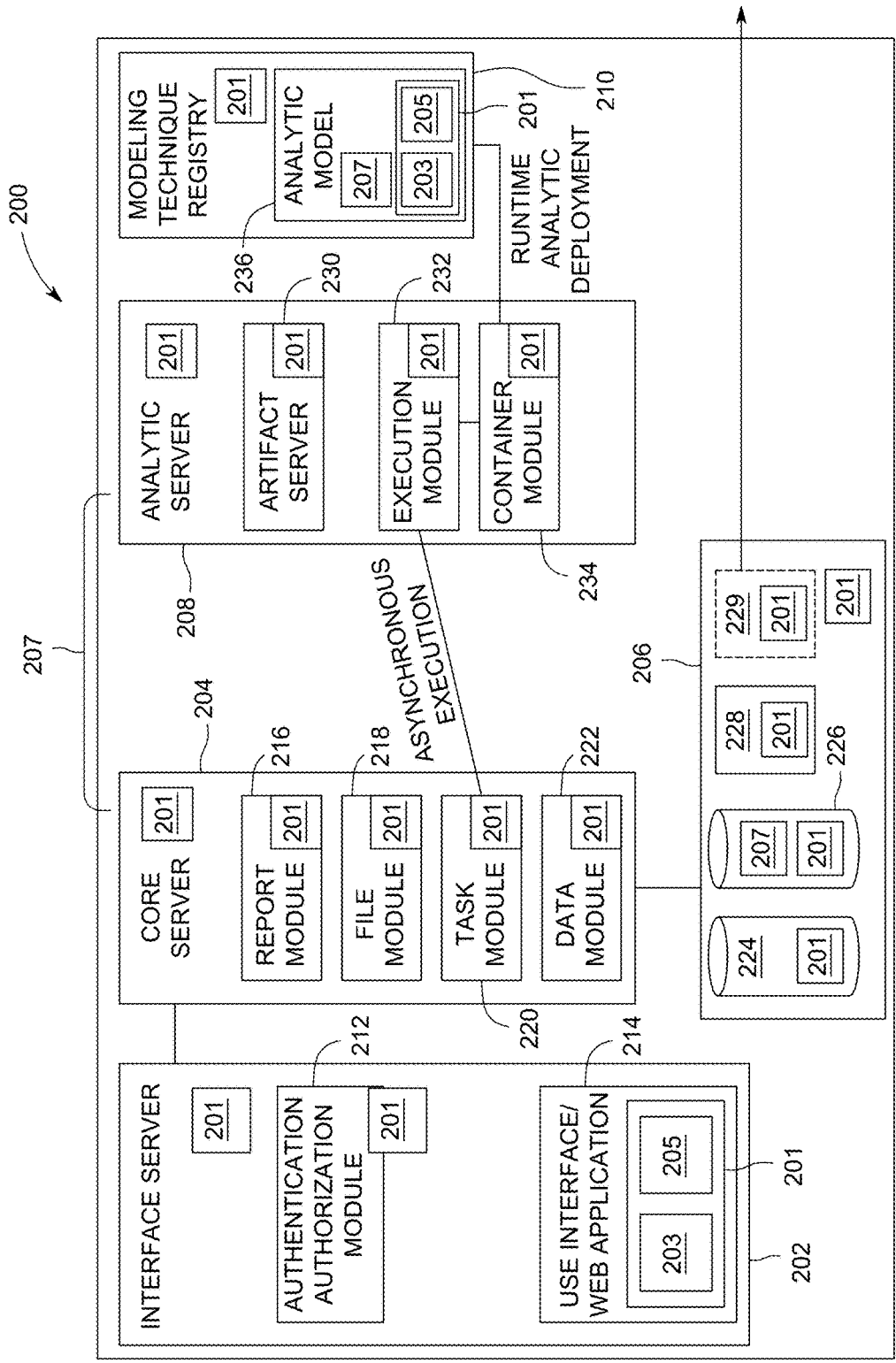
FIG. 2 illustrates a system architecture according to some embodiments.

Turning to FIG. 2, the high-level architecture (e.g., platform) 200 of the system 100 is provided, in accordance with some embodiments. In some embodiments, the platform 200 may host or include an interface server 202, a core server 204, storage 206, an analytic server 208, and a modeling technique registry 210.

In some embodiments, the interface server 202 may include an authentication/authorization module 212. The authentication/authorization module 212 may be programmed to authenticate at least one of a model developer and platform developer and authorize at least one of the model developer and the platform developer to develop and execute models for the system 100, respectively. In some embodiments, the authentication module 212, in conjunction with application specific access controls, may be used to control both access to the system (authentication) and operations a developer may be allowed to perform within the system (authorization). The interface server 202 may also include an interactive graphical user interface display 214 (e.g., web application) according to some embodiments. The display 214 may include an area 502 (FIG. 5) to develop models, as described herein. In some embodiments, within the platform 200, one or more interface servers 202 may be coupled to, and may provide programmatic or web interfaces 214 to one or more core server(s) 204.

In one or more embodiments, the core server 204 may host one or more applications or modules (e.g., Report Module 216, File Module 218, Task Module 220, and Data Module 222). In some embodiments, the applications or modules may be micro-services. In one or more embodiments, the Report Module 216 may allow specific reports to be retrieved from the storage 206.

In one or more embodiments, the Task Module 220 may be a task manager, and may start/stop/get the status of any model-related task. In one or more embodiments, the Task Module 220 may: prepare an input file for analysis; trigger the execution module 232 to run the model; update the task status; parse the model output and register the input and output artifacts with a database.

In one or more embodiments, the Data Module 222 may provide access to various specific persistent storage elements. The core server 204 is, in turn, shown to be coupled to one or more memories/storage 206. In one or more embodiments, the storage 206 may be a persistent storage. In one or more embodiments, the storage 206 may be an external storage element. The storage 206 may include at least one of one or more relational databases (e.g., SQL store) 224, one or more NoSQL or non-relational data stores (e.g., NoSQL stores) 226, and one or more Binary Large OBject (BLOB) Stores 228. In one or more embodiments, the non-relational data store 226 may include one or more data tables that may index model metadata for facilitating searching and accessing via the model. In one or more embodiments, the storage 206 may include an interface 229, which may be used to communicate with an element outside of the platform 200. In some embodiments, the platform 200 may be extended to use storage 206 like Hadoop, Time Series, Triple store, and other suitable storage.

In some embodiments, the analytic server 208 may host an artifact module 230, an execution module 232 and a container module 234.

In some embodiments, the tasks or models developed in the task module 220 may be executed by the execution module 232. In one or more embodiments, this execution may be remote. In some embodiments, the execution module 232 may: execute arbitrary shell commands on a host operating system; invoke a Docker-based model (or any other suitable model) when the shell command is a bash script; be secured with HTTPS client certificate authentication; send execution status updates to the task module 220.

Figure 12:
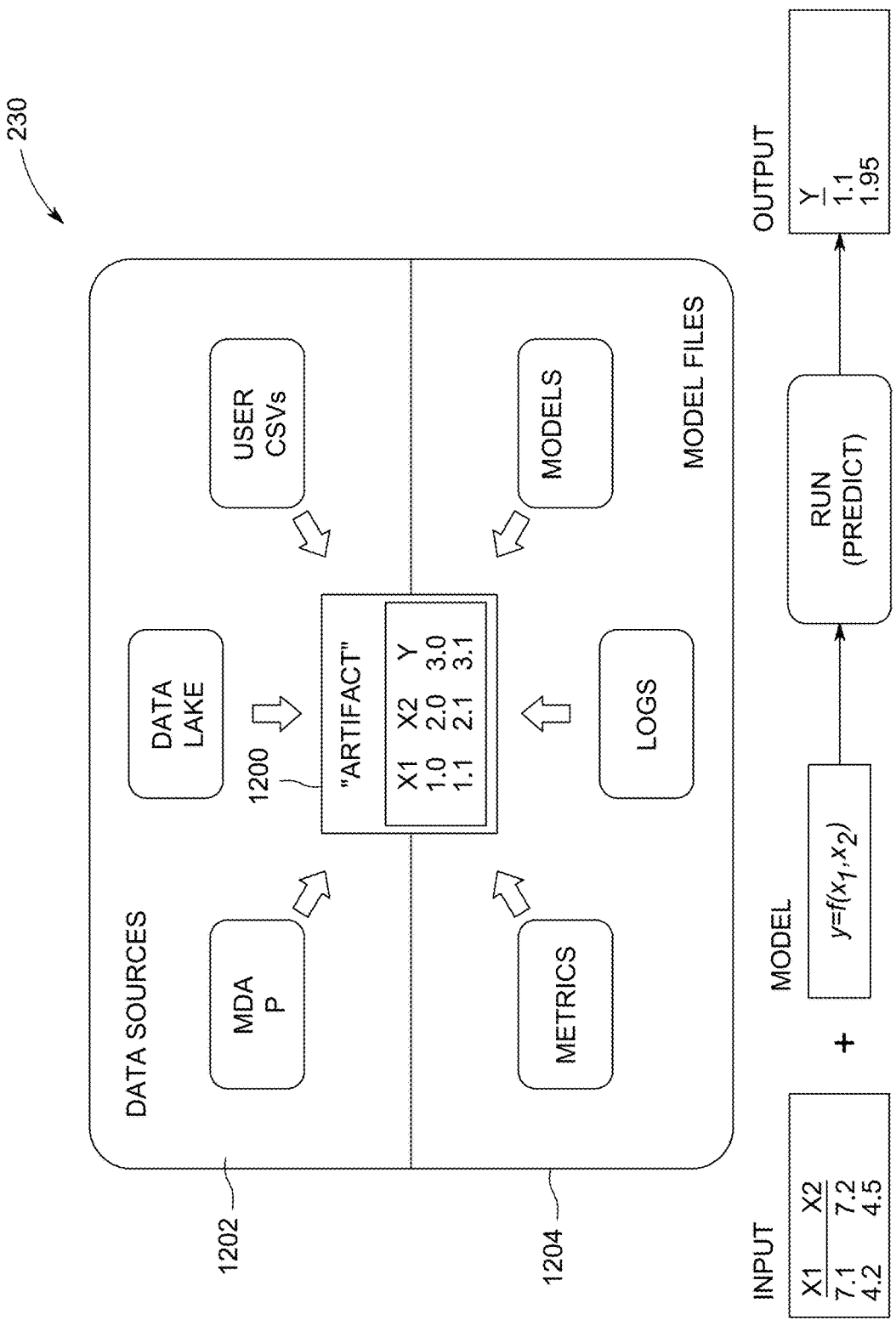
FIG. 12 illustrates a block diagram of the artifact module according to some embodiments.
Figure 13:
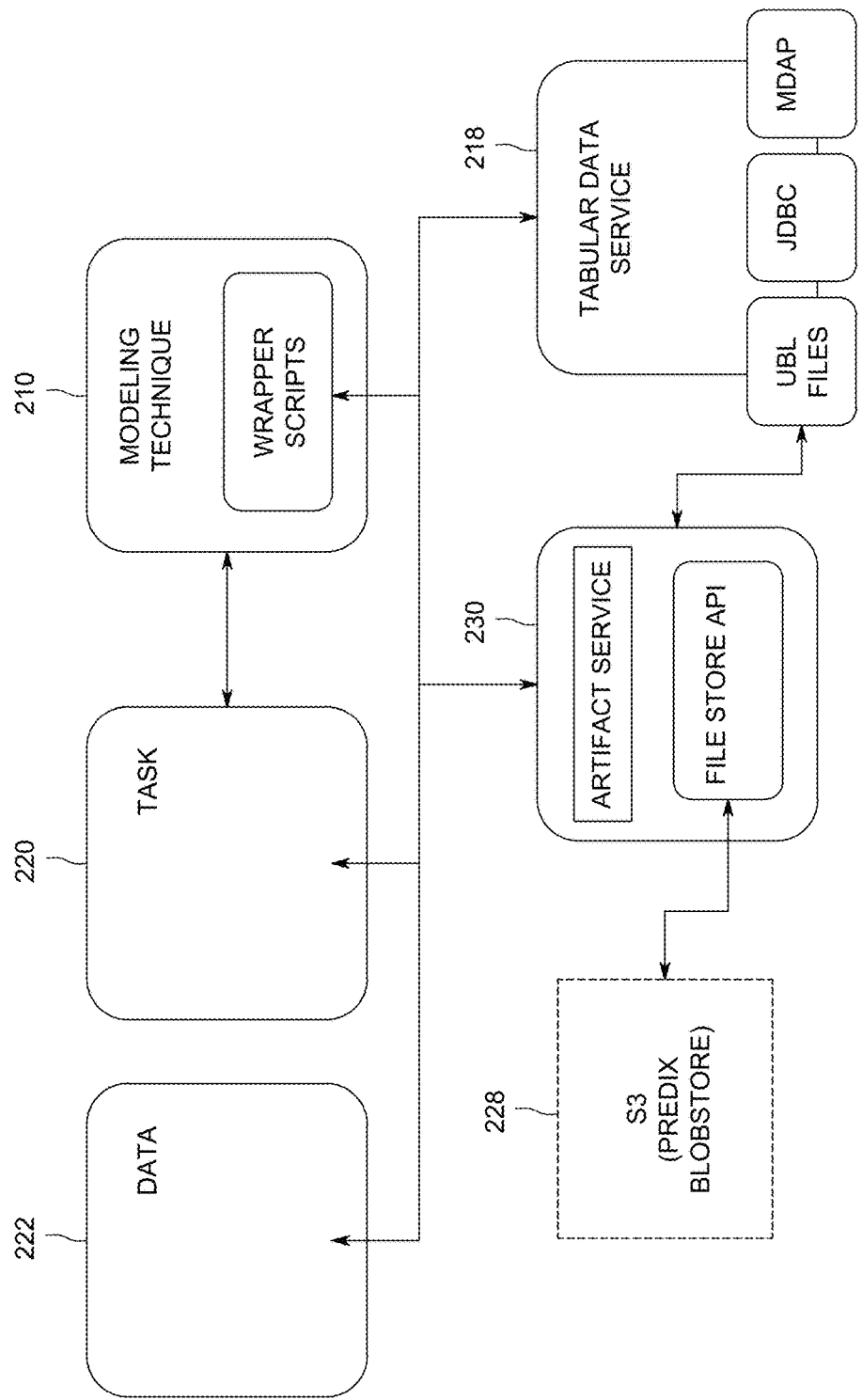
FIG. 13 illustrates a block diagram of the system according to some embodiments.

In one or more embodiments, the artifact module 230 may be a distributed service for provisioning, collecting, extracting and the persistence of artifacts required or produced by execution of model tasks. An artifact 1200 (FIG. 12) may be any piece of electronic data that is stored in some sort of file (e.g., text, binary, numbers, logs, a compiled executable, etc.). As shown in FIG. 12, data sources 1202 (e.g., MDAP, Data Lake, User CSVs) as well as model files 1204 (e.g., metrics, logs, input information, models, output information) may have data that may be indexed by the artifact module 230. In one or more embodiments, the model 236 may have information indexed by the artifact module 230 because the co-efficients of the model may be stored elsewhere. In one or more embodiments, as shown in FIG. 13, the artifact module 230 may receive artifacts from the BLOBstore 228, the data module 222, the task module 220, the file module 218 and the modeling technique registry 210, and may transport the artifacts 1200 to any of the BLOBstore 228, the data module 222, the task module 220, the file module 218 and the modeling technique registry 210. In one or more embodiments, the artifact module 230 may: fetch input artifacts 1200 and store them as files on temporary file storage, accessible by the model; upload artifacts 1200 output by the model to the artifact module 230; and run from bash shell scripts invoked by the execution module 232. Prior to execution, the artifact module 230 may provision the necessary artifacts 1200 in a temporary locally accessible path to allow the models 236, and other software, to run the same in a local development environment and a production/execution environment. In one or more embodiments, when the model developer develops a model, the model developer may use locally stored data and other files/artifacts. By providing all necessary data files and other artifacts locally, the Artifact Module 230 may allow the model to execute the same way in the production environment as when it was being developed in the development environment. In some embodiments, when the software completes its task, the Artifact module 230 may also be responsible for collecting the produced artifacts from the temporary workspace (not shown) and persisting them in permanent storage 206.

In some embodiments, the execution module 232 may turn any model (e.g. computational operation or shell command) into a Representational State Transfer (REST) web service. REST web services may refer to an architectural style and communication approach that may be easy to consume by other applications via their web Application Programming Interface (API). In one or more embodiments, turning a model into a web service may be described as publishing the model 236 in the form of a REST end point. The REST end point form may make the model 236 easy to use by other services or applications (e.g., in a cloud environment). In one or more embodiments, the platform 200 may include a log module (not shown) that may store log entries into a triple store when invoked via the REST. In some embodiments, the inputs to the model 236 may be transmitted to the task module 220 from the execution module 232 in order for the technique container to be executed. In some embodiments, the transmission may be asynchronously executed. As used herein in this regard, "asynchronous execution" means that the requesting module is not waiting for the task to be completed by the execution model 232. Instead, in some embodiments, the requesting module sends a request, specifying a call-back end point where the requesting module wants to receive information when there is an update about the status of the task. For example, in some embodiments, the requesting module may effectively say to the execution module "do this task (x) and call me back at the following address (y) when you are done."

In one or more embodiments, as will be further described below, the execution module 232 may execute at least one task. In one or more embodiments, the model 236 is created by executing a collection of tasks. Some examples of tasks that the execution module may execute are building a model, predictions using a model, estimating missing data, generating space filling designs. Other suitable tasks may be used. In one or more embodiments, the execution module 232 may execute the tasks locally and externally. For example, in some instances, tasks may be local to the execution module 232 and the work may happen locally (e.g., a local small model build or a model prediction), however in other instances the task may require the job to be run elsewhere (e.g., a massively parallel Hadoop instance or a High Performance Computing (HPC) environment like CRAY).

The output (e.g., model as a REST web service) of the execution module 232 may be received by the container module 234 in some embodiments. As used herein, in some embodiments, the "output" may refer to one or more outputs. In some embodiments the container module 234 may wrap each analytic model 236 in a complete filesystem that may contain everything needed to run the model (e.g., code, runtime, system tools, system libraries, and anything that may be installed on a server). In one or more embodiments, the complete filesystem may be referred to as an Application Programming Interface (API) wrapper 201. In one or more embodiments, the analytic model 236 may be formed from one or more component- or sub-models, as described further below. Each of the model and component models may have its own API wrapper 201. The inventors note that containerizing the model may allow the model to run the same, regardless of the environment; and may also allow the components of the model, and the model itself, to run independently such that if one component of the model fails, the whole model does not fail. The inventors further note that containerization may also contribute to resilience toward failures of the underlying infrastructure. For example, if the hardware (physical or virtual) that the container is running on fails while the task is being executed, the system may restart the same container on a different computer node to allow the task to complete. While Docker containers may be described herein, any other suitable containers may be used (e.g., springboot, NodeJS, Angular JS, cloud foundry, etc.).

In one or more embodiments, when the analytic model is executed (e.g., runtime analytic deployment), a containerized model 236 may be registered and stored in the modeling technique registry 210. In response to deployment, in some embodiments, the modeling technique registry 210 may register the new containerized model 236 on the platform 200.

In one or more embodiments, each element in the platform 200 (e.g., interface server 202, core server 204, storage 206, analytic server 208 and modeling technique registry 210), as well as each sub-element (e.g., authentication/authorization module 212, user interface/web application 214, report module 216, file module 218, task module 220, data module 222, relational databases (e.g., SQL store) 224, NoSQL or non-relational data stores (e.g., NoSQL stores) 226, Binary Large OBject (BLOB) Stores 228, interface 229, artifact module 230, execution module 232, container module 234, and analytic model 236), may also be associated with an API wrapper 201. As for the API wrapper associated with the model 236, each API wrapper 201 associated with each element and sub-element of the platform 200 may define the input information (input, source of input) to the element/sub-element, at least one instruction defining a function of the element/sub-element and the output information (output, destination of output) from the element/sub-element. In one or more embodiments, inputs sources may be any file type (e.g., comma separated, tab separated, binary, etc.), relational databases (e.g., Oracle), non-relational databases (e.g., NoSQL), large data stores (e.g., Hadoop) or streaming sources (e.g., twitter). As such, the API wrapper 201 may allow each element and sub-element in the platform 200 to be "self-aware" and "self-registering." As used herein, in one or more embodiments, "input" may refer to one or more inputs and "output" may refer to one or more outputs.

In one or more embodiments, the platform element's and sub-element's ability to know the input information 203 (e.g., inputs, the source of the inputs) and the output information 205 (e.g., outputs and the destination of the outputs) via the API wrapper 201 may make the element/sub-element "self-aware." The inventors note that only the API wrapper 201 in the user interface/web application 214 sub-element and in the model 236 sub-element in FIG. 2 shows the input information 203 and output information 205, to simplify the figures, as all API wrappers 201 may include input information 203 and output information 205.

As used herein, "self-registering" means that the element/sub-element may provide information about its contents, working rules and capabilities via emission of a unique signature (e.g., via the API wrapper 201) to register itself in any system with valid interface and security settings. In one or more embodiments, the API wrapper 201 may define the elements/sub-elements in such a way that they plug themselves into the development platform 200 upon completion and may make themselves available for further development activities. A benefit of "self-registering," is that the element/sub-element may communicate with another element, model, or system, for example, about what information it may need and what information it may provide. In some embodiments, the one or more elements/sub-elements of the platform 200 may communicate with each other via the API wrapper 201, because they include the same API wrapper structure (input, function, output), and the API wrapper structure includes instructions about the destination of the output.

In one or more embodiments, each element and sub-element of the platform 200 may be complete by itself (e.g., may not need to be part of a system). Additionally, in one or more embodiments, each element and sub-element of the platform 200 may not need to be configured to be part of another system. Rather, the API wrapper 201 may allow each element and sub-element to be seamlessly part of another system, as the API wrapper 201 may provide the inputs/outputs for each element/sub-element, thereby providing the structure for a relationship between the elements/sub-elements of different systems.

Figure 3A:
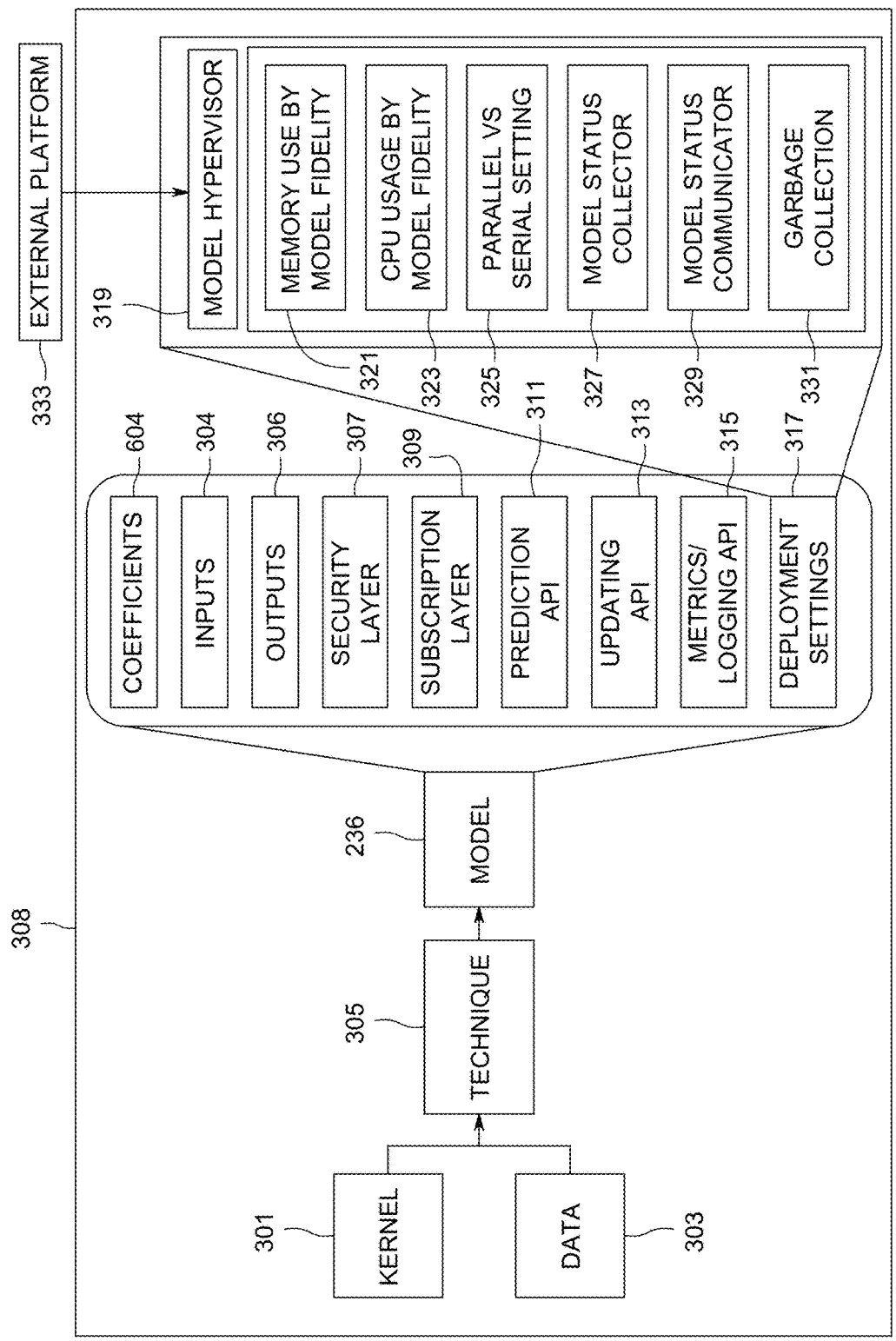
FIGS. 3A and 3B illustrates a component and execution platform according to some embodiments.
Figure 11:
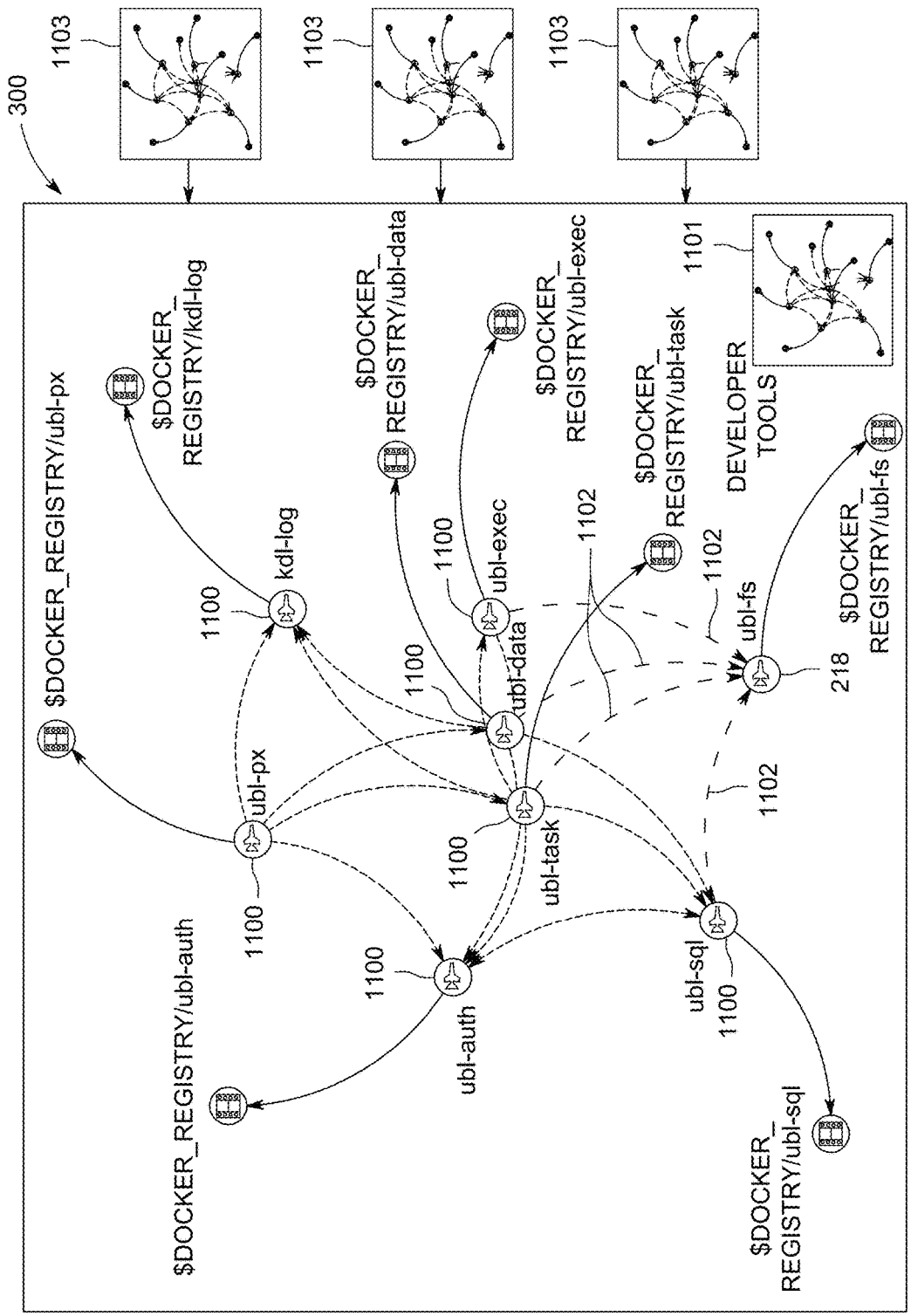
FIG. 11 illustrates a deployment diagram according to some embodiments.

Turning to FIG. 11, a diagram of an example of the communication between the sub-elements on the platform 200 is provided. Each sub-element 1100 (e.g., authentication/authorization module 212, user interface/web application 214, report module 216, file module 218, task module 220, data module 222, relational databases (e.g., SQL store) 224, NoSQL or non-relational data stores (e.g., NoSQL stores) 226, Binary Large OBject (BLOB) Stores 228, interface 229, artifact module 230, execution module 232, container module 234, and analytic model 236) may be executed independently of each-other, except where they are dependent. For example, the sub-elements 1100 indicated by a dark-dotted link 1102 may be dependent on the fs (file module) sub-element 218. In one or more embodiments, each sub-element 1100 may be configured to run independently or as part of a bigger system. In one or more embodiments, the fact that each sub-element 1100 may be run independently may allow the sub-element to be run on any system or platform with a suitable API interface. For example, the sub-element may seamlessly be run on an execution platform 333 (FIG. 3A), because the execution platform 333 is written in the same manner as the development platform (e.g., with a same or similar API wrapper structure). In one or more embodiments, self-discoverable units may be the individual components that make up the execution platform. For example, the analytic container is a self-discoverable unit. In one or more embodiments, the sub-elements 1100 may be individual items anchored to the repository 310, and the sub-elements 1100 may be pulled by the artifact module 230, for example, when they are needed in the development of the platform 308. In one or more embodiments, the platform developer may define the development environment variables for orchestrating individual actions.

Figure 3B:
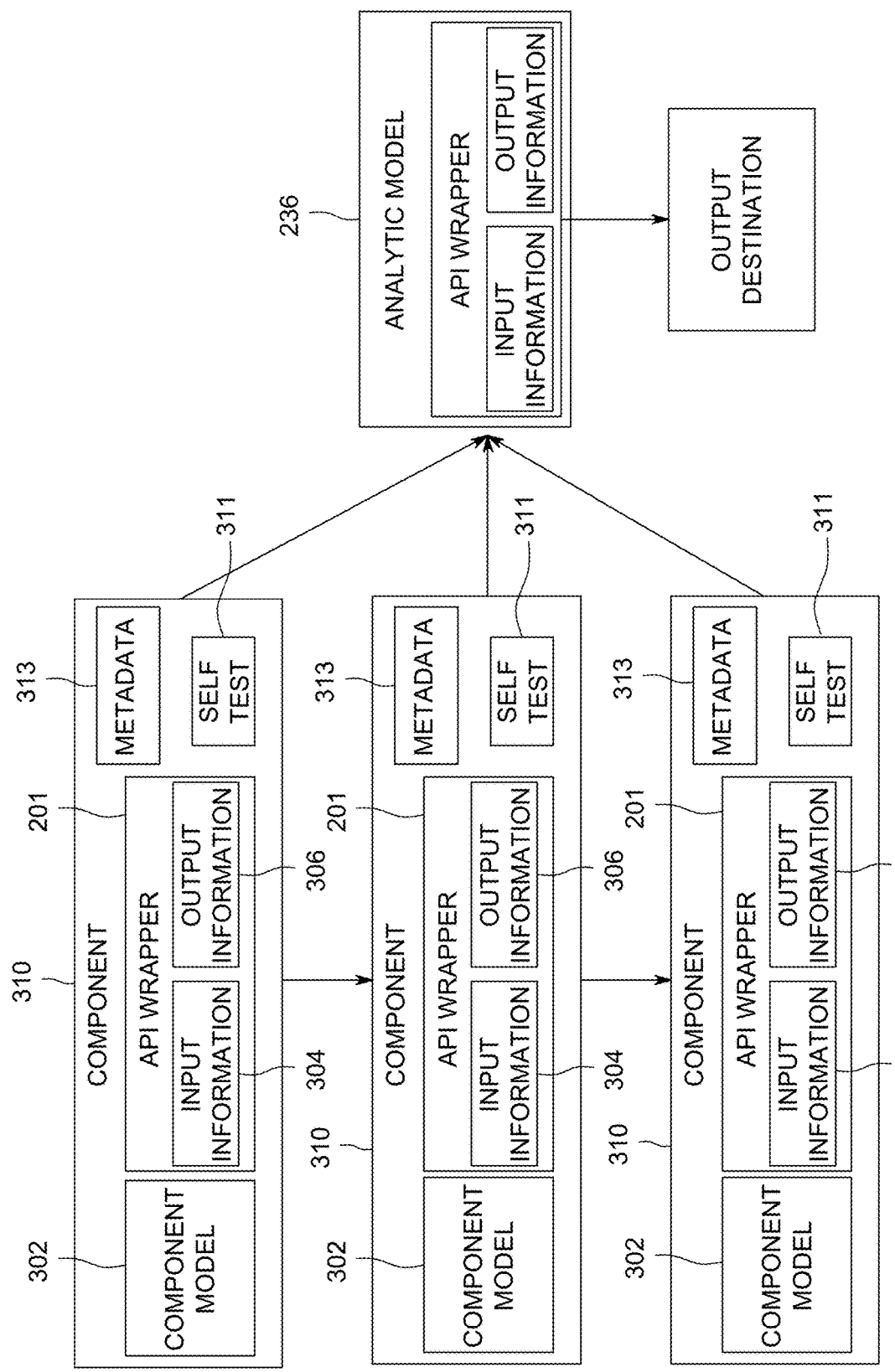

Turning back to FIGS. 3A and 3B, an example of an analytic model 236 and an external platform 333 are provided. As used herein, the terms "external platform" and "external system" may be used interchangeably to refer to a platform/system outside of a development platform 308. In some embodiments, there may be no distinction between a development environment and a development platform 308. Conventionally, a development environment is distinct from a platform, whereby the development environment includes modifiable code and the platform includes code for execution but not modification. Conventionally, when a model developer develops a model in the development environment, they have to determine if they are using the latest code that is compatible with a model that will be run on the platform. Then, conventionally, the model developer determines all of the blocks (e.g., compiler, editor, data stores repositories, linked libraries, static libraries, dependencies), needed to install and run the model in the platform.

In one or more embodiments, some portion or all of the code for the development platform 308 (e.g., the code for the platform, components to run the code (e.g., compilers, linkers, packagers), to manage (e.g., editor, timing checks), test and debug the code), as well as a repository (not shown) may be populated for the model developer when the development platform is generated. The inventors note that providing all of the elements of the platform in the development environment, development and deployment of models may be much faster because the model developer may just focus on creating the model and may not have to determine the platform specifics and dependencies of platform elements to execute the model. For example, embodiments may provide for a deployment time of models that may be 10 times faster than conventional deployment. The inventors also note that while conventionally it may take 2-6 weeks' time to set up a new model developer with a development environment before they may begin creating or developing the models, embodiments may allow for model developer set-up in about an hour and a half. Embodiments may provide for the seamless and independent integration of developed system elements of the platform, as each element of the platform is self-aware and self-registering, as described below. Embodiments provide an integrated system for development, testing and deployment. For example, in one or more embodiments, the system may provide all necessary items for the developer to develop the code, test it with standard datasets and test cases and validate their new code and then deploy the code into the platform and test it in the platform. In one or more embodiments, unit testing and regression testing tools may be provided to the developers along with development tools.

In one or more embodiments, the model developer may use the user interface/web application 214 to develop the model 236. Development of the model 236 may include a kernel 301 (e.g., a building block of models). The kernel 301 may be the functional form of a model with generic co-efficients. For example, $y=a*x+b$ is a kernel 301 with coefficients a and b; and $T_{metal}=N*(T_{hot}-T_{cold})$ is a kernel with coefficient N. In one or more embodiments, the kernel 301 and data 303 may be received by a technique 305. In one or more embodiments, data may come from a variety of sources, such as operationally measured parameters, observed inspection data, etc. In one or more embodiments, the technique 305 may be a solution methodology, in general. In one or more embodiments, with respect to a module build or update, the technique 305 may be the "method" that generates the specific values of the coefficients in the kernel. For example, Regression, ANN and PCE, etc. may be several techniques for building data-driven models; EKF, UKF, Particle filters, Bayesian updating, etc. may be model updating techniques; BEST analysis, Area metric, etc. may be data comparison techniques; and OLH, RLH, CCD etc. may be DOE generation techniques. In one or more embodiments, the model 236 may codify a relationship between inputs and outputs. The model 236 may be developed from one or more kernels 301 by estimating the values of coefficients in the Kernels 301, through the technique 305, to fit data 303. In one or more embodiments, the model 236 may be a fully specified mathematical representation of the relationship between the inputs and outputs. For example, the coefficients in the kernel $y=a*x+b$ may be estimated through Bayesian estimation to form a model $y=1.2*x+0.5$ In some embodiments, the model 236 may include coefficients 604 (FIG. 6), inputs 304, outputs 306, a security layer 307, a subscription layer 309, a prediction API 311, an updating API 313, a metrics/logging API 315, and a deployment settings 317. In one or more embodiments, the one or more co-efficients, the one or more inputs, the one or more outputs, the security layer, the subscription layer, the prediction API, the updating API, the metrics/logging API, and the deployment settings module may be integrated by the model API 201. In one or more embodiments all of (one or more co-efficients, the one or more inputs, the one or more outputs, the security layer, the subscription layer, the prediction API, the updating API, the metrics/logging API, and the deployment settings module) may act as "input information" in the API model.

In one or more embodiments, the security layer 307 may secure the model 236 at all levels; and may allow segmented access to different parts of the model 236. For example, users may have the ability to use the model 236 without having any access to coefficients.

In one or more embodiments, the subscription layer 309 may allow the use of the models 236 for a specified number of uses or for a specified amount of time. In some embodiments, the subscription layer 309 may enable renewals to use of the model, and may provide for self-destruction of the model after a limited use.

In one or more embodiments, the prediction API 311 may provide the capability to make predictions using the model 236. In some embodiments, the prediction API 311 may be combined with security layer 307 and the subscription layer 309 to define what predictions are enabled. For example, if a model is y=a*x+b*z+c*w, the prediction API 311 may be set such that the user may only see the following: 1. Y=f(x) where the user may only enter values for x; and/or 2. Y=a*x+c*w+g( . . . ) where the user may see there are two inputs, x and w, with specific co-efficients, etc.

In one or more embodiments, the updating API 313 may provide the capability to update the model 236 with new data. In some embodiments, the updating API 313 may be combined with the security layer 307 and the subscription layer 309 to define what updates may be enabled, similar to the prediction API 311.

In one or more embodiments, the metrics/logging API 315 may provide metrics of the model 236 as newer predictions are made (i.e., as new inputs are provided to the model for predictions). In some embodiments, logging of actions may be provided as the model is used for any purpose.

In one or more embodiments, the deployment settings 317 may allow the model 236 to be deployed in a variety of systems. For example, the same model may be deployed on an edge device and on a high performance computing infrastructure. Based on the deployment settings, the model 236 may decide whether it runs fast (e.g., because of reduced computations resources on the edge) or run in full mode. Depending on the settings, different security and subscription settings 307, 309 may be automatically triggered. In some embodiments, this may enable model flexibility and may allow the model to self-optimize to specific environments and requirements.

In one or more embodiments, the deployment settings 317 may include a model hypervisor 319. In some embodiments, the model hypervisor 319 may be a virtual machine manager that may manage operations between the development platform 308 and one or more external platforms 333. In one or more embodiments, the model hypervisor 319 includes its own API and it interfaces with the model API.

In one or more embodiments, the model 236 may be executed on the external platform 333. In one or more embodiments, the model 236 may be executed from the development platform 308.

In some embodiments the model hypervisor 319 may include a memory usage by model fidelity module 321, a CPU by usage model fidelity module 323, a parallel vs serial settings model 325, a model status collector 327, a model status communicator 329, and a garbage collection module 331. In one or more embodiments, model fidelity may refer to the quality (or version) of the model required. For example, if a highly accurate model is desired, the model building process may need to be run on a high performance computing environment because it needs large computing resources. On the other hand, if a simplified approximate model is sufficient, then the model build process may be executed on a "cheaper" computer that has lower CPU and memory capability.

In one or more embodiments, the model hypervisor 319 may execute the parallel vs serial settings model 325 to determine whether to enable parallel execution or serial execution of model build, model prediction, data estimation algorithms etc. In one or more embodiments, the model hypervisor 319 may determine whether to enable parallel execution based on the external platform 333 capabilities and the analytic model 236 requirements. For example, if a highly accurate model is desired, the model building process needs to be run on a parallel high performance computing environment because it needs large computing resources. On the other hand, if a simplified approximate model is sufficient, then the model build process can be executed on a "cheaper" serial computer that has lower CPU and memory capability. In one or more embodiments, if parallel execution is enabled, the model hypervisor may choose to split one large problem into many smaller problems that are interconnected (memory parallel) or detect that the problem is a collection of smaller NON connected (independent) problems that can be solved independently (embarrassingly parallel). In one or more embodiments, if the model hypervisor 319 enables parallel execution, the analytic model 236 may be executed and may assemble the results of the execution.

In one or more embodiments, the model status communicator 329 may be a layer in the model hypervisor 319 responsible for communicating with the external system 333. In one or more embodiments, another layer in the development platform may enable this communication. For example, the task module 220 may communicate with the execution module 232 and the execution module 232 may communicate with the analytic model 236.

In one or more embodiments, the temporary files may be stored in temporary or permanent locations. In one or more embodiments the garbage collection module 331 may know to go and clean up temporary files from all locations. Based on the security settings, in some cases, none of the temporary files may be cleaned up. For example, if a particular customer requires all their files to be retained, the system may be set to not delete/remove any files associated with that customer.

In one or more embodiments, the analytic model 236 may include one or more functional components 302 (FIG. 3B), hereinafter referred to as "component models". In some embodiments, each component model 302 may represent a different function or task that may be executed as part of the execution of the analytic model 236.

For example, each of data ingestion, data cleaning and executing the analytic may be component models. Other suitable component models may be used. In one or more embodiments, each of the component models 302 may be independent and complete by itself and may not need to be part of a system.

In one or more embodiments, each of the component models 302 may know what its inputs are and what its outputs are. For example, if the component model is y=x+ab, the component model 302 may know that "x" is the input, "ab" are the coefficients and "y" is the output. The component model 302 may also know where input is coming from (e.g., one or more sources) and where the output is going (e.g., one or more destinations). In some embodiments, the source may be a file, a data stream, a data warehouse, a user and a database. Other suitable data sources may be used.

In one or more embodiments, the input and output may be in a JSON format or any other suitable format. The inventors note that while standardized inputs and outputs in any form that may be applicable to programming languages may be used, the use of a JSON format may be beneficial as it is a standard that may be supported by many programming languages and it may allow representation of all required and optional information needed for the running of any model. JSON format may also be flexible by allowing new information to be added without having to change the underlying software. In one or more embodiments, there may be more than one output. In some embodiments, at least one output may be a JSON file, while the other outputs may be other file types. In one or more embodiments, the one JSON output is what the system may expect in order to collect information regarding the outcome of the task. Again due to the generality of the JSON format, different models may include model-specific information in the JSON document. Any markup language may also be used. Many types of outputs (which may be used as inputs in some aspects) may also be generated such as binary formats such as Matlab .mat files, Python pickle files etc. Other suitable formats may be used.

In one or more embodiments, input information 304 (e.g., the input and source of the input) and output information 306 (e.g., output and destination) may be stored in, or encoded by, an application programming interface (API) wrapper 308 that may be associated with the component model 302. In some embodiments, the API wrapper 308 may be associated with the component model 302 per the definition of the API. In some embodiments, the API may include standard elements (e.g., input information, modeling technique, output information). In one or more embodiments, the API may include the modeling technique/the process to create a model. In one or more embodiments, the API may define the model, but the model may be completed with its elements that are outside the API (e.g., coefficients and terms). In one or more embodiments, the API may include other suitable standard elements. Together, the component model 302 and the API wrapper 308 may form a component 310. In one or more embodiments, the platform (e.g., system architecture) 200 may not accept the component 310 unless the standard elements (e.g., input information, modeling technique, output information) of the API are defined. In one or more embodiments, the component model's 302 ability to know the inputs, the source of the inputs, the outputs and the destination of the outputs via the API wrapper 308 makes the component 310 "self-aware." In one or more embodiments, metadata 313 for the component 310 may be stored in the component 310 when the component is running. In some embodiments, for the component 310 to be self-aware, the component may also pull metadata 313 from the storage element 206 (e.g., non-relational data stores 226). In some embodiments, since the component 310 knows what its inputs should be and their source, the component 310 may pull the inputs from the sources, as needed.

Conventionally, models may not know what data they will receive or the source of the data, and the models also may not know where the output of the model is going. Rather, conventionally, each time the model is executed, the input, source, and output destination may be specified, which may be time-consuming and error-prone, as a user may not be sure what information to specify. The inventors note that in embodiments, the component 310 defines the input information and output information as part of the component 310 package, facilitating deployment and management of the model 236. In some embodiments, for a model developer to make use of the model 236 (and the associated components 310), the input information 304 and output information 306 may be defined prior to use.

In one or more embodiments, the component 310 may include an integrated self-test 311. The self-test 311 may help maintain the health of the system, and may also facilitate integrating new modeling techniques in the system. In one or more embodiments, the self-test 311 may allow the models to check themselves periodically with new and existing datasets and trigger corrective actions to update the model if the model quality deviates beyond defined thresholds.

In one or more embodiments, the component 310 may also be "self-registering". As used herein, "self-registering" means that the component 310 may provide information about its contents, working rules and capabilities via emission of a unique signature (e.g., via the API wrapper 308) to register itself in any system with valid interface and security settings. A benefit of "self-registering," is that the component 310 may communicate with another component, model, or system, for example, about what information it may need and what information it may provide. In some embodiments, the one or more components 310 may communicate with each other via the API wrapper, because they include the same API wrapper structure (input, model, output), and the API wrapper structure includes instructions about the destination of the output.

In one or more embodiments, each component 310 may be self-aware, and then the self-aware components may form a self-aware analytic model 236, which may, in turn, be combined with other models to form a bigger model and system. In some embodiments, each of the one or more components 310 (e.g., a plug-in, add-in or macro) may add a specific service or feature to a larger model.

Figure 4:
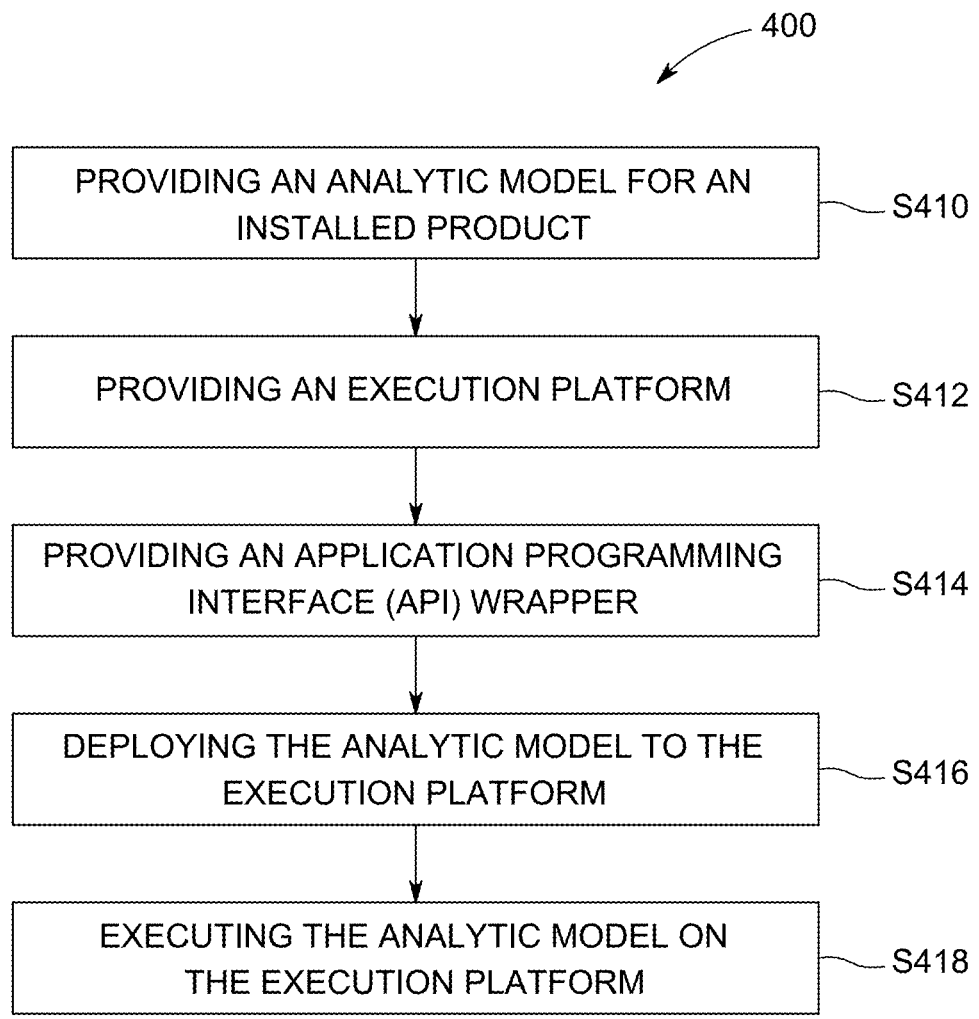
FIG. 4 illustrates a flow diagram according to some embodiments.

FIG. 4 illustrates a process of operation 400 that may be performed by some or all of the elements of the system 100 and platform 200 described with respect to FIGS. 1 and 2. Process 400 and other processes described herein may be performed using any suitable combination of hardware (e.g., circuit(s)), software or manual means. For example, a computer-readable storage medium may store thereon instructions that when executed by a machine result in performance according to any of the embodiments described herein. Software embodying these processes may be stored by any non-transitory tangible medium including a fixed disk, a floppy disk, a CD, a DVD, a Flash drive, or a magnetic tape. Examples of these processes will be described below with respect to embodiments of the system, but embodiments are not limited thereto. In one or more embodiments, the system 100 is conditioned to perform the process 400 such that the system is a special-purpose element configured to perform operations not performable by a general-purpose computer or device. The flow charts described herein do not imply a fixed order to the steps and embodiments of the present invention may be practiced in any order that is practicable.

Initially, at S410, an analytic model 236 may be provided for an installed product 102. Then at S412 an execution platform 333 may be provided on which to run the analytic model 236. In S414, an API wrapper 201 may be provided for each of the analytic model 236 and the execution platform 333. As described herein, in one or more embodiments, the API wrapper 201 may define the input information (input, source of input) to the model/execution platform, at least one instruction defining a function of the model/execution platform and the output information (output, destination of output) from the model/execution platform. As such, the API wrapper 201 may allow each model 236 and execution platform 333 to be "self-aware" and "self-registering."

Then in S416, the analytic model 236 may be deployed or exported to the execution platform 333. In one or more embodiments, the external platform 333 may provide information about its capabilities to the model hypervisor 319 via the output of the execution platform's API wrapper 201. In one or more embodiments, the output of the execution platform's API wrapper 201 may be the input expected by the analytic model 236 as defined in the model API wrapper, such that the model 236 and execution platform may communicate and function together. The inventors note that by deploying the analytic model 236 to the execution platform 333 via communication between each of their respective API's is beneficial because the model developer does not need to specialize or modify their model for a specific executing environment.

In one or more embodiments, the model hypervisor 319 may determine, based on this output information, what fidelity of analytic model 236 to execute on the external platform 333, using settings in the model hypervisor 319. As described above, model fidelity may refer to the quality of the model required. For example, if a highly accurate model is desired, the model building process may need to be run on a parallel high performance computing environment because it needs large computing resources. On the other hand, if a simplified approximate model is sufficient, then the model build process may be executed on a "cheaper" serial computer that has lower CPU and memory capability.

Then in S418, the analytic model 236 may be executed on the execution platform S418.

Figure 5:
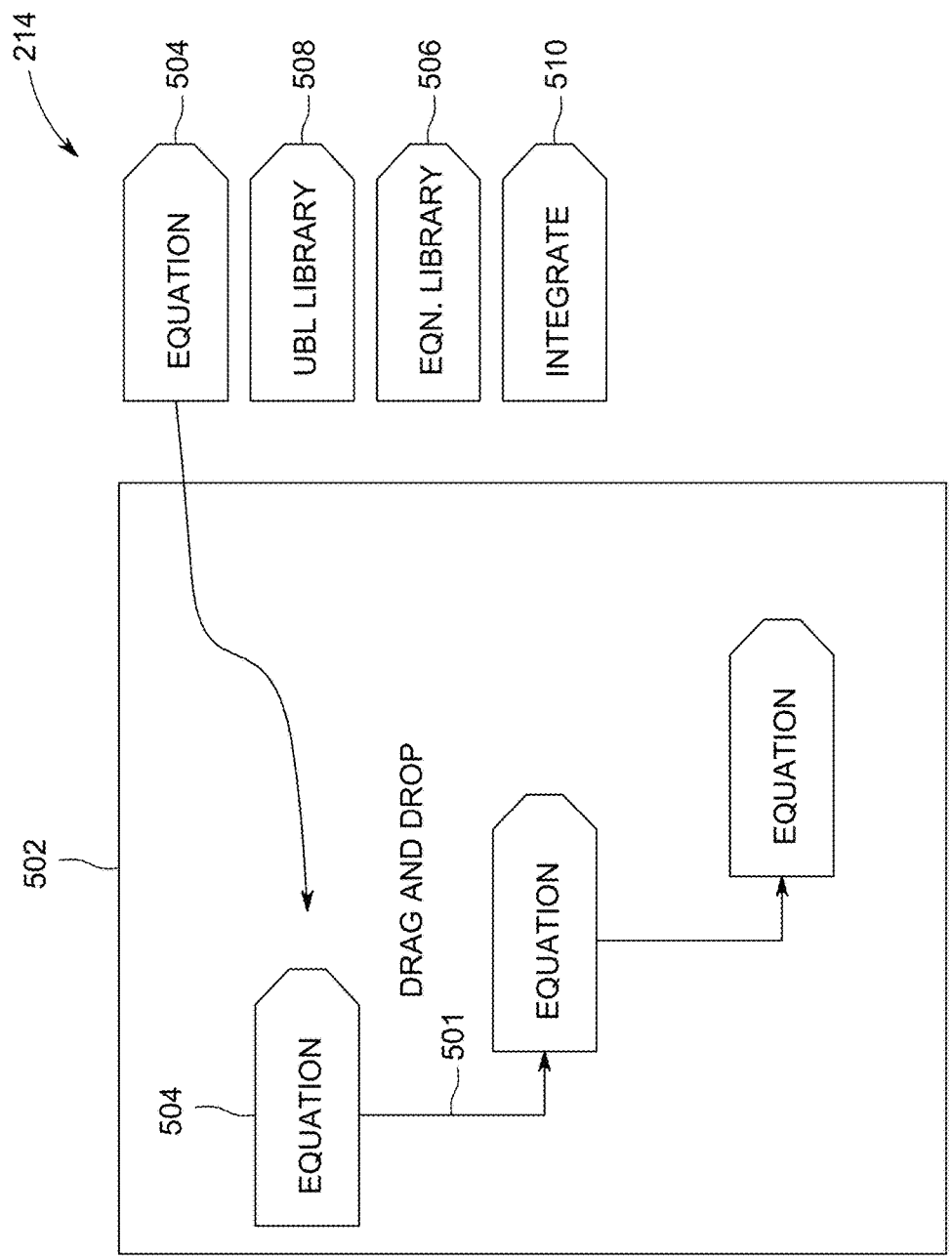
FIG. 5 illustrates an interface according to some embodiments.

Turning to FIG. 5, a graphical user interface for development of an analytic model 236 that may be generated on the platform 308 is provided according to some embodiments. The user interface 214 may include an area 502 to develop the models. In one or more embodiments, the model 236 may be made from one or more component models (not shown), that together form the model 236. A component model may be an individual model that may work with one or more other component models to form the model. For example, a first component model may be an ingestion model and a second component model may be a data cleaning model. As used herein, the term "model" may refer to either the model 236 or the component models. The model 236 may include equations 504 inserted (e.g., via drag and drop functionality) from an equation library 506, or developed by the model developer without the use of the equation library 506. In developing the model, the model developer may use other suitable libraries 508 (e.g., Usage Based Lifing library, Scipy library, KDL Sparklgraph library, etc.). In one or more embodiments, the libraries 508 may be stored in the repository 310. After the model developer has included the desired equations in the area 502, and linked 501 them as desired, the model developer may select an integrate tab 510 to integrate the equations together to form the model.

As used herein, the model is the action or task to perform with received inputs. For example, a task of a data ingestion model may be to funnel data to a next model; and a task of a data cleaning model may be to clean the input data (e.g., remove noise, determine if any data is missing, check for anomalies).

Figure 6:
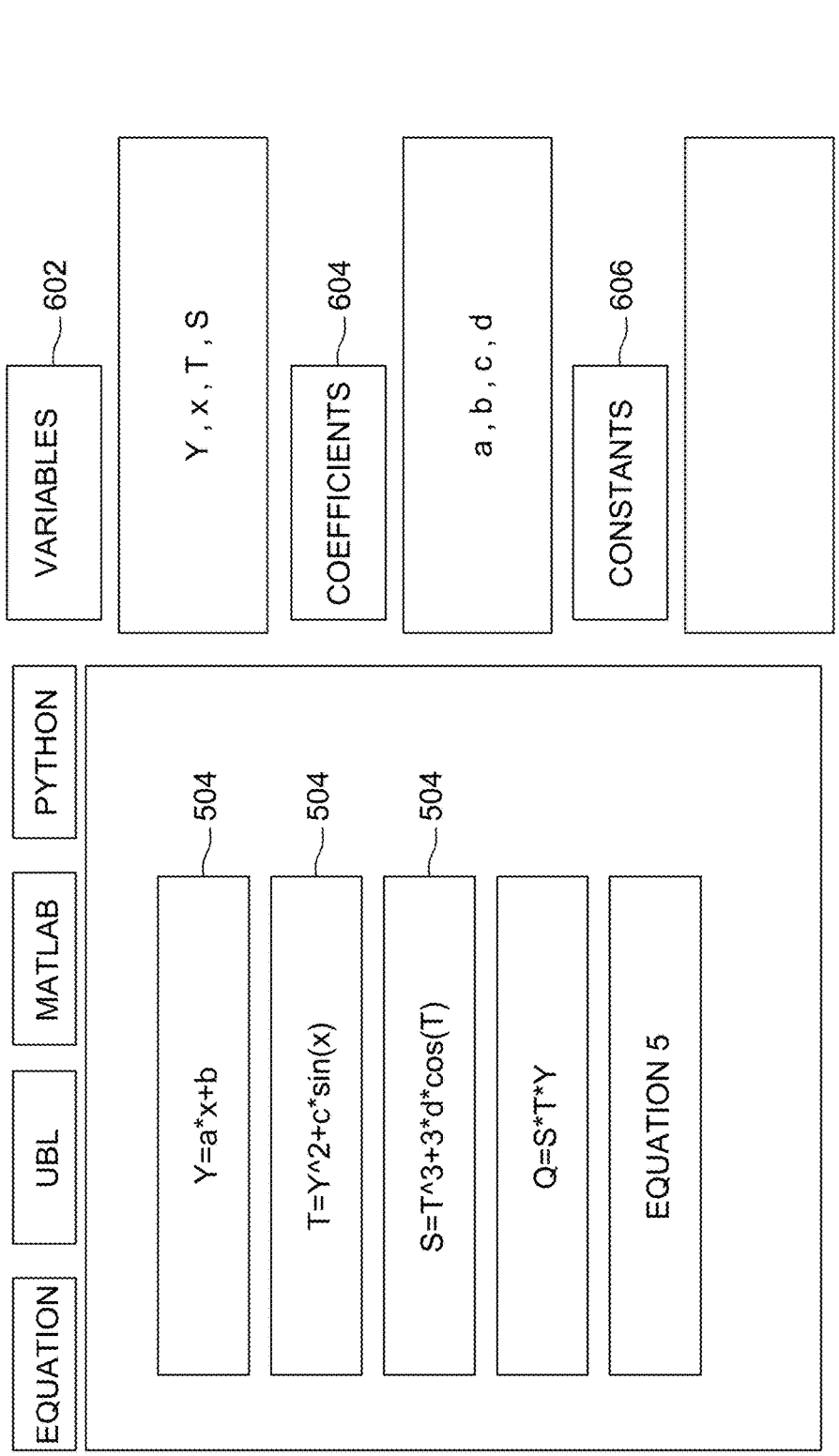
FIG. 6 illustrates an interface according to some embodiments.

In one or more embodiments, an API wrapper 201 may be defined for association with the model 236 via execution of the container module 234. For example, FIG. 6 provides the interface 214 for the model developer to define the API wrapper 201. As described above, the API wrapper 201 may store or encode input information 203 (e.g., the input and source of the input) and output information 205 (e.g., output and destination) that may be associated with the model 236. In one or more embodiments, after the model 236 is created, when the model 236 is compiled, the model 236 knows where to pull the inputs from per the API wrapper 201, even if the model developer does not have access to those inputs. In one or more embodiments, the developer may also define co-efficients 604 and constants 606. In one or more embodiments, the developer may link each variable 602 to a data header (not shown) in the code. For example, the developer may include an instruction in the model to write to database X, and the model will get the information from database X during execution of the model, but the developer may not actually see the contents of the database.

In some embodiments, the API wrapper 201 may include standard elements (e.g., input information, modeling technique, output information). In one or more embodiments, the API wrapper 201 may include the modeling technique/the process to create a model. In one or more embodiments, the API wrapper 201 may define the model, but the model may be completed with its elements that are outside the API wrapper 201 (e.g., coefficients and terms). In one or more embodiments, the API wrapper 201 may include other suitable standard elements.

In one or more embodiments, the model's 236 ability to know the input information 203 (inputs, the source of the inputs) and the output information 205 (outputs, the destination of the outputs) via the API wrapper 201 may make the model 236 "self-aware." In one or more embodiments, metadata 313 for the model 236 may be stored in the model 236 when the model 236 is running. In some embodiments, for the model 236 to be self-aware, the model may also pull metadata 313 from the storage element 206 (e.g., non-relational data stores 226). In some embodiments, since the model 236 knows what its inputs should be and their source, the model 326 may pull the inputs from the sources, as needed.

Conventionally, models may not know what data they will receive or the source of the data, and the models also may not know where the output of the model is going. Rather, conventionally, each time the model is executed, the input, source, and output destination may be specified, which may be time-consuming and error-prone, as a user may not be sure what information to specify. The inventors note that in embodiments, the API wrapper 201 associated with the model 236 defines the input information and output information, facilitating deployment and management of the model 236. In some embodiments, for a model developer to make use of the model 236, the input information 203 and output information 205 may be defined prior to use.

In one or more embodiments, the self-aware model 236 may also be "self-registering". As used herein, "self-registering" means that the self-aware model 236 may provide information about its contents, working rules and capabilities via emission of a unique signature (e.g., via the API wrapper 201) to register itself in any system with valid interface and security settings. A benefit of "self-registering," is that the model 236 may communicate with another component, model, or system, for example, about what information it may need and what information it may provide. In some embodiments, the one or more models 236 may communicate with each other via the API wrapper 201, because they include the same API wrapper structure (input, model technique, output), and the API wrapper structure includes instructions about the destination of the output.

In one or more embodiments, the modeling module 108 may, via the analytic server 208, associate the model 236 with the API wrapper 201, as defined by the API wrapper.

Figure 7:
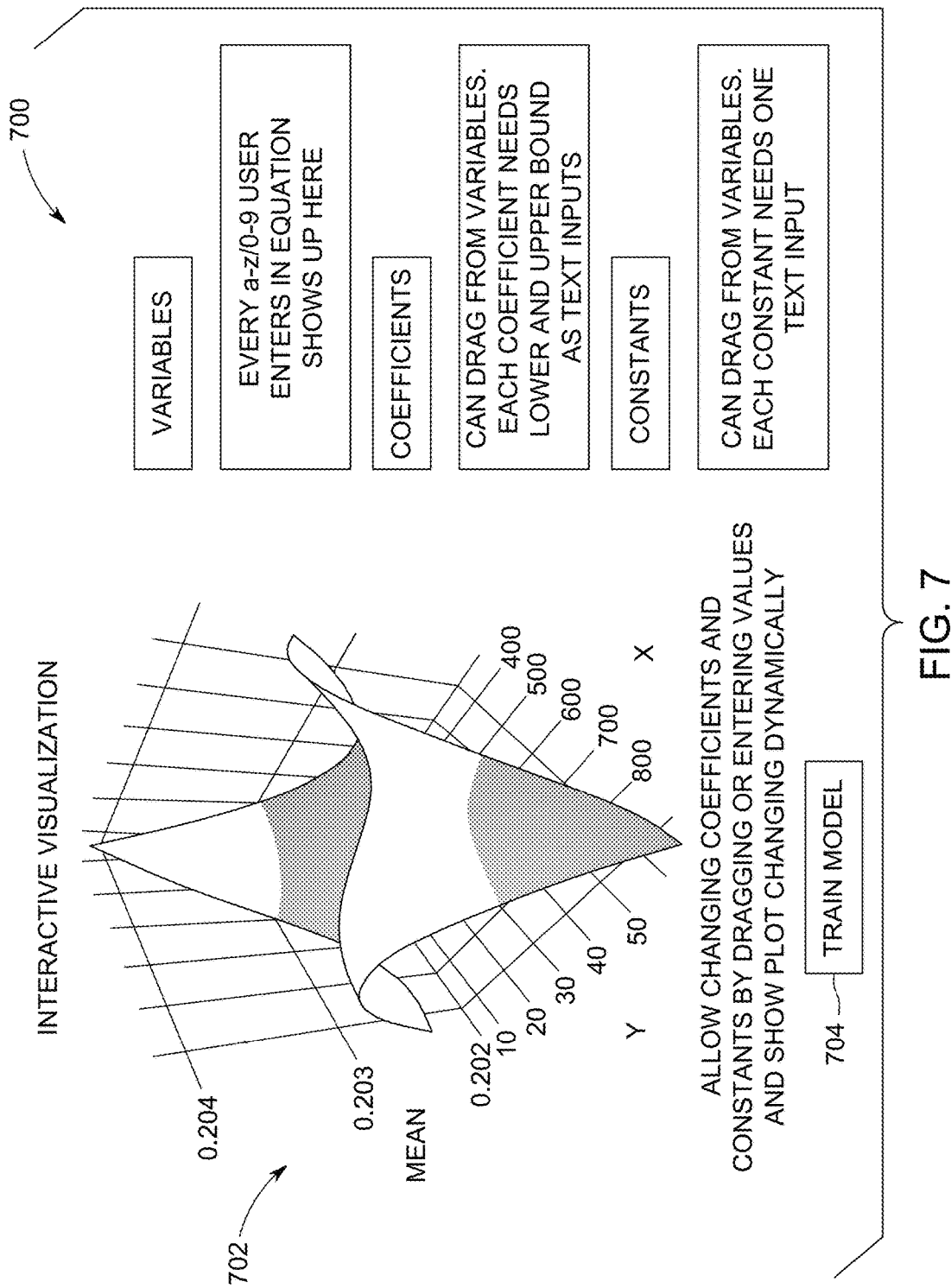
FIG. 7 illustrates an interface according to some embodiments.

In one or more embodiments, an interactive visualization 700 (FIG. 7) of the model 236 may be provided in a user interface. In one or more embodiments, the interactive visualization 700 may be generated after providing the equations 504 and defining the input information 203 and output information 205 (e.g., variables 602), as well as the coefficients 604, and constants 606 (FIG. 6). In one or more embodiments all of the information entered in the equation 504 may be included in the interactive visualization. In one or more embodiments, the model developer may dynamically change the plot 702 to see how the changes affect the results. For example, in one or more embodiments, the model developer may change the co-efficient and constants by dragging them from the variables 602 or entering values. In one or more embodiments, each co-efficient 604 may have an upper and lower bound as text inputs. In one or more embodiment, each constant 606 may have at least one text input. In one or more embodiments, after the model developer is satisfied with the model, per the interactive visualization 700, the model developer may select a "train model" indicator 704. While a button indicator is used to select "train model," any other suitable indicator may be used. After selection of the "train model" indicator, the system 100 may then train the model (e.g., compute the value of each co-efficient 604).

Figure 9:
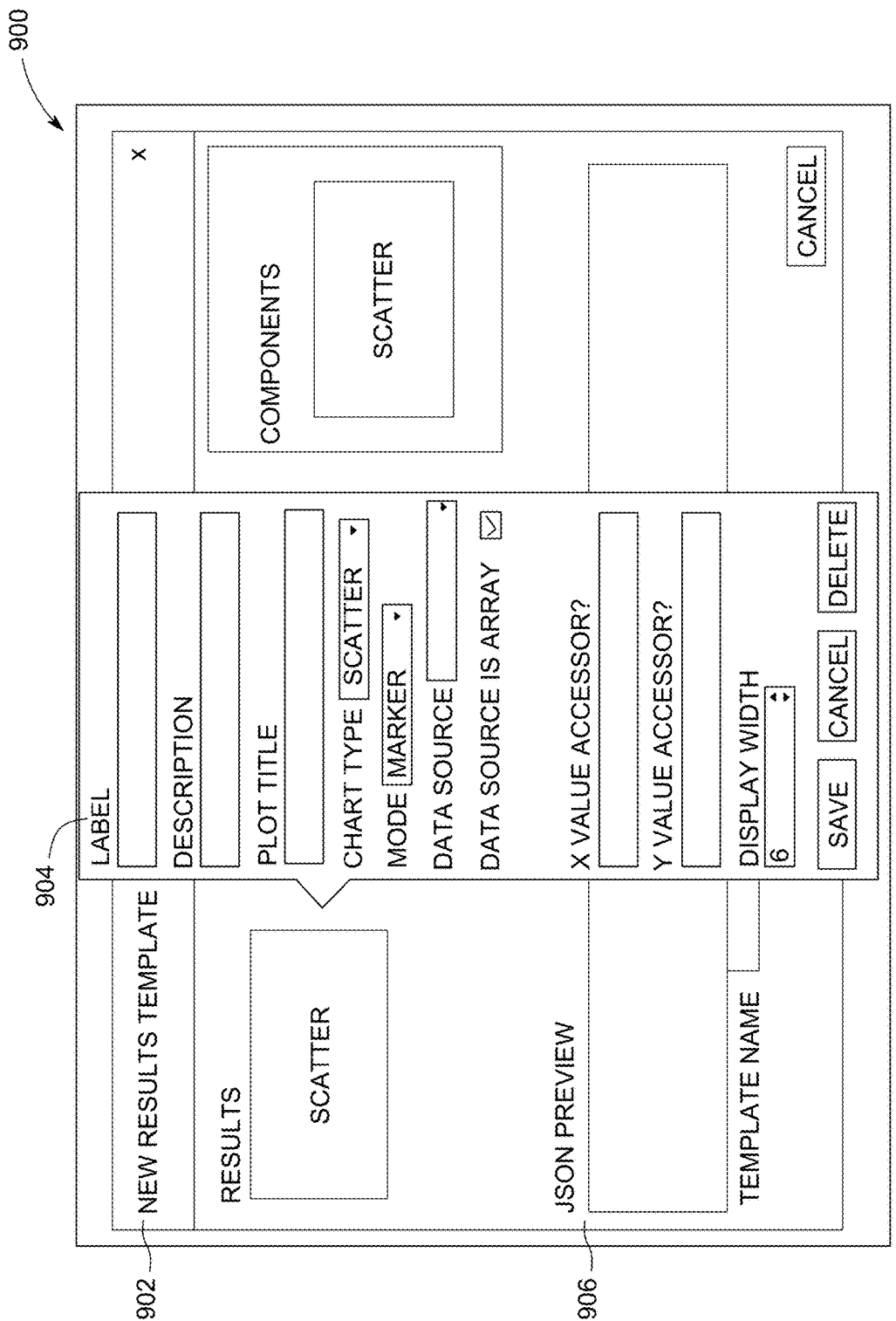
FIG. 9 illustrates an interface according to some embodiments.

Turning to FIGS. 8 and 9, a user interface for registering the model/technique 800 and results 900 is provided, respectively. In one or more embodiments, registration of the technique may occur before the model is created so that a model developer may then go choose the technique to build the model. In one or more embodiments, registering the technique may enable any code to be added by a developer (typically an advanced user) may develop a technique based on their own expertise and then may use the system's API definitions to "wrap" their technique in a provided docker container. In one or more embodiments, this may include providing build scripts for building the container for the new analytic and executing the containers. Then, using the interface shown in 900, the technique developer may set the input and output pages for the technique along with the command required to run the technique. Once the registration is successfully completed and the technique is approved for use, the technique may come up in list of available techniques for any user to build models.

After the technique 800 is registered, the model developer may also register a results template 902 to provide a structure for the results of execution of the model technique. For example, the template 902 may include one or more fields 904 that may be populated with information. As shown in FIG. 9, for example, the fields 904 may include a label for the results, a description, a plot title, a chart type, a mode, a data source, an indication if the data source an array, an indication if an array item is an object, an X value accessor a y-value accessor, and a display width. In one or more embodiments the information to populate the fields may be selected from at least one of drop-down menus (e.g., chart type, mode, data source, display width), user-entry fields (e.g., label, description, plot title), selection of boxes or radio buttons (data source is array, array item is object), and selectable from another source (e.g., X value accessor, y value accessor). In one or more embodiments, the results template 902 may include a preview of the output 906 of the model technique.

Figure 10:
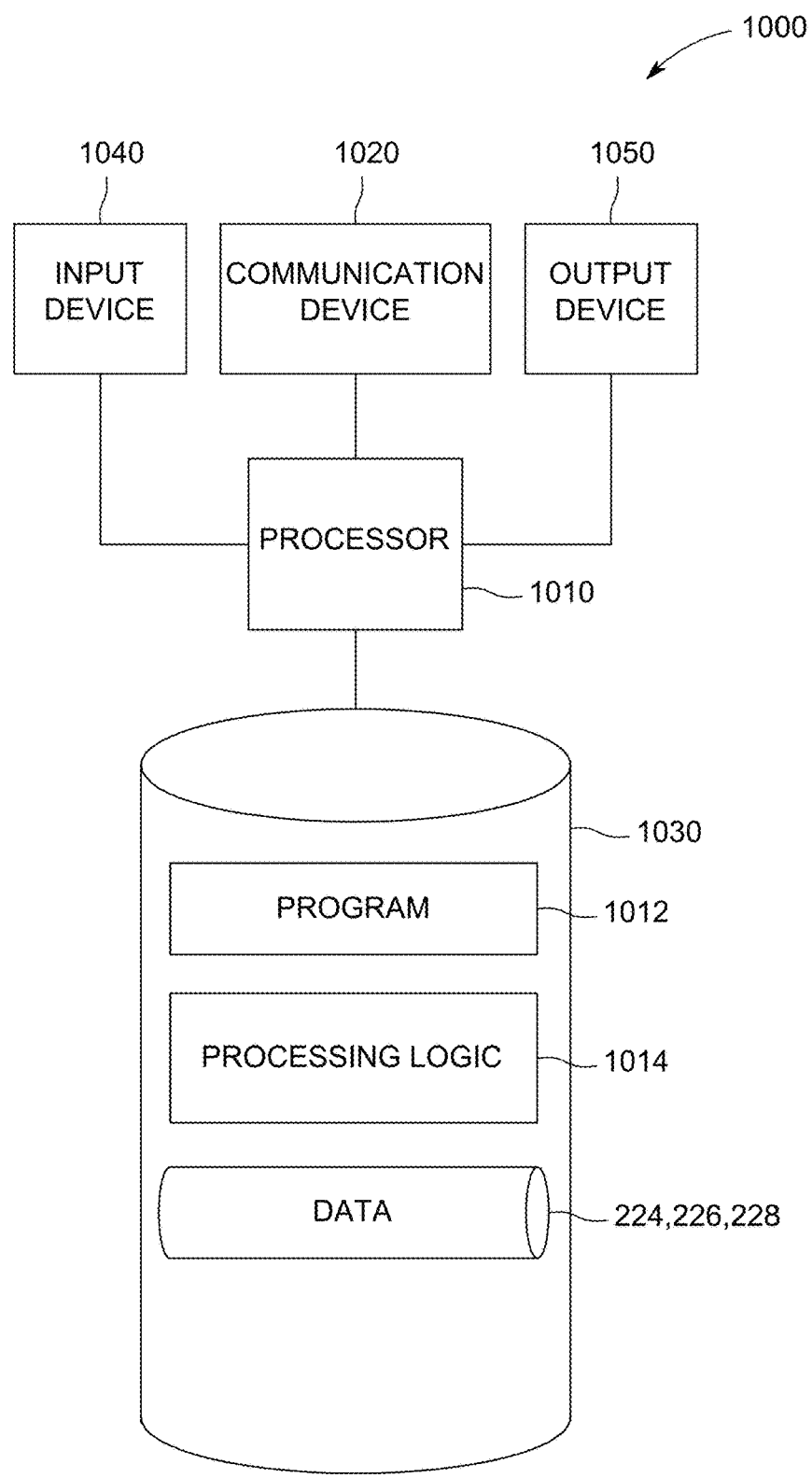
FIG. 10 illustrates a block diagram of a system according to some embodiments.

Note the embodiments described herein may be implemented using any number of different hardware configurations. For example, FIG. 10 illustrates an analytic development and processing platform 1000 that may be, for example, associated with the systems 100, 200 of FIGS. 1 and 2, respectively. The analytic development and processing platform 1000 comprises an analytic and development processor 1010 ("processor"), such as one or more commercially available Central Processing Units (CPUs) in the form of one-chip microprocessors, coupled to a communication device 1020 configured to communicate via a communication network (not shown in FIG. 10). The communication device 1020 may be used to communicate, for example, with one or more users. The analytic development and processing platform 1000 further includes an input device 1040 (e.g., a mouse and/or keyboard to enter information about the installed product or the model) and an output device 1050 (e.g., to output and display the data and/or recommendations).

The processor 1010 also communicates with a memory/storage device 1030. The storage device 1030 may comprise any appropriate information storage device, including combinations of magnetic storage devices (e.g., a hard disk drive), optical storage devices, mobile telephones, and/or semiconductor memory devices. The storage device 1030 may store a program 1012 and/or analytic development and processing logic 1014 for controlling the processor 1010. The processor 1010 performs instructions of the programs 1012, 1014, and thereby operates in accordance with any of the embodiments described herein. For example, the processor 1010 may receive a component model and then may apply the modeling module 108 via the instructions of the programs 1012, 1014 to generate an analytic model 236.

The programs 1012, 1014 may be stored in a compressed, uncompiled, compiled and/or encrypted format. The programs 1012, 1014 may furthermore include other program elements, such as an operating system, a database management system, and/or device drivers used by the processor 1010 to interface with peripheral devices.

As used herein, information may be "received" by or "transmitted" to, for example: (i) the platform 1000 from another device; or (ii) a software application or module within the platform 1000 from another software application, module, or any other source.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, any or all of the elements depicted in the block diagrams and/or described herein; by way of example and not limitation, a modeling module. The method steps can then be carried out using the distinct software modules and/or sub-modules of the system, as described above, executing on one or more hardware processors 1010 (FIG. 10). Further, a computer program product can include a computer-readable storage medium with code adapted to be implemented to carry out one or more method steps described herein, including the provision of the system with the distinct software modules.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims. Aspects from the various embodiments described, as well as other known equivalents for each such aspects, can be mixed and matched by one of ordinary skill in the art to construct additional embodiments and techniques in accordance with principles of this application.

Those in the art will appreciate that various adaptations and modifications of the above-described embodiments can be configured without departing from the scope and spirit of the claims. Therefore, it is to be understood that the claims may be practiced other than as specifically described herein.

The invention claimed is:

1. A system comprising:
an analytic model for an installed product;
an execution platform configured to execute the analytic model;
an application programming interface (API) wrapper associated with each of the analytic model and the execution platform, the API wrapper including input information, output information and a technique; and
a storage in communication with the analytic model and the execution platform and storing program instructions to perform the functions as follows:
transmitting information between the analytic API wrapper and the execution platform API wrapper; and
deploying the analytic model to the execution platform based on the transmitted information;
wherein the analytic model further comprises:
one or more co-efficients, one or more inputs, one or more outputs, a security layer, a subscription layer, a prediction API, an updating API, a metrics/logging API, and a deployment settings module.

2. The system of claim 1, wherein the analytic model is hosted on a development platform.

3. The system of claim 2, wherein the development platform is distinct from the execution platform.

4. The system of claim 1, wherein the one or more co-efficients, the one or more inputs, the one or more outputs, the security layer, the subscription layer, the prediction API, the updating API, the metrics/logging API, and the deployment settings module are integrated by the model API.

5. The system of claim 1, wherein the deployment settings module further comprises:
a model hypervisor configured to receive the execution platform API wrapper.

6. The system of claim 1, further comprising one or more fidelities of the analytic module.

7. The system of claim 6, wherein the model hypervisor is configured to decide which fidelity of the analytic model to execute on the execution platform.

8. The system of claim 5, wherein the model hypervisor includes a memory usage by model fidelity module; a CPU usage by model fidelity, a parallel vs serial settings model, a model status collector, a model status communicator, and a garbage collection module.

9. The system of claim 1, wherein the analytic model is self-registering.

10. A method comprising:
providing an analytic model for an installed product;
providing an execution platform to execute the analytic model;
providing an application programming interface (API) wrapper associated with each of the analytic model and the execution platform, the API wrapper including input information, output information and a technique; and
deploying the analytic model to the execution platform based on communication between the analytic model API wrapper and the execution platform API wrapper;
wherein the analytic model further comprises:
one or more co-efficients, one or more inputs, one or more outputs, a security layer, a subscription layer, a prediction API, an updating API, a metrics/logging API, and a deployment settings module.

11. The method of claim 10, wherein deploying the analytic model to the execution platform further comprises:
receiving input information at an API associated with a model hypervisor of the analytic model from the execution platform API wrapper.

12. The method of claim 11, wherein the input information received at the model hypervisor is output from the execution platform API wrapper.

13. The method of claim 10, further comprising:
defining the API wrapper associated with each of the analytic model and the execution platform prior to deployment.

14. The method of claim 10, further comprising:
executing the analytic model on the execution platform.

15. The method of claim 10, further comprising:
determining which fidelity of the analytic model to execute on the execution platform.

16. The method of claim 10, further comprising:
determining whether to enable parallel execution or serial execution.

17. The method of claim 16, further comprising:
assembling the output of an executed analytic model on the execution platform if parallel execution is enabled.

18. The method of claim 14, further comprising:
executing a garbage collection module in response to execution of the analytic model to at least one of clean and store one or more temporary files and data generated by execution of the analytic model.

19. The method of claim 9, wherein the analytic model is self-registering.

* * * * *